United States Patent [19]

Akiyama et al.

[11] 3,801,388

[45] Apr. 2, 1974

[54] PRINTED CIRCUIT BOARD CROSSOVER AND METHOD FOR MANUFACTURING THE SAME

[75] Inventors: Katsuhiko Akiyama, Atsugi; Yuji Kajiyama, Sagamihara, both of Japan

[73] Assignee: Sony Corporation, Tokyo, Japan

[22] Filed: Sept. 25, 1972

[21] Appl. No.: 291,909

[30] Foreign Application Priority Data

Sept. 30, 1971 Japan ................................ 47-76443

[52] U.S. Cl. ........................ 156/3, 156/17, 174/68.5, 317/101 CE

[51] Int. Cl. .............................................. H05k 3/06

[58] Field of Search ............174/68.5; 317/101 CC, 317/101 CM, 101 CE, 101 A; 156/3, 156/2, 7, 8, 17

[56] References Cited

UNITED STATES PATENTS

| | | | |
|---|---|---|---|
| 3,461,524 | 8/1969 | Lepselter | 174/68.5 UX |
| 3,539,705 | 11/1970 | Nathanson et al. | 175/68.5 |
| 3,615,949 | 10/1971 | Hicks | 174/68.5 UX |
| 3,647,585 | 3/1972 | Fritzinger et al. | 174/68.5 X |

OTHER PUBLICATIONS

Dypcak, "Method of Making Air–Insulated Crossovers," Western Electric, Technical Digest No. 16, Oct. 1969, pages 3 & 4.

*Primary Examiner*—Darrell L. Clay
*Attorney, Agent, or Firm*—Lewis H. Eslinger et al.; Alvin Sinderbrand, Esq.

[57] ABSTRACT

A printed circuit board which has an insulating base plate, a plurality of conductors spearately formed on the insulating base plate, conductive studs formed on the ends of two of the conductors, and cross-over conductor connected to the conductive studs but electrically isolated from one of a plurality of conductors passing between the ends of the two conductors. The cross-over conductor is shaped to have a configuration such that its end portions are wider than its mid portion. The material forming the studs are selected different from the material forming all of the conductors so that they are not removed by the same etchant.

4 Claims, 21 Drawing Figures

PRINTED CIRCUIT BOARD CROSSOVER AND METHOD FOR MANUFACTURING THE SAME

BACKGROUND OF THE INVENTION

The present invention relates generally to a printed circuit board in which parts of leads are crossed over without being electrically connected with one another and also to a method of making the printed circuit board. In prior art printed circuit boards such cross-overs are typically accomplished by soldering an extra wire to connect the terminals on the board or by plating through holes in the board to connect the ends of a conductor on one side of the board with a cross-over conductor on the other side of the board. Both of such methods are unreliable and are relatively expensive, time consuming steps in the manufacturing process.

SUMMARY OF THE INVENTION

A printed circuit board according to the present invention comprises an insulating base plate, first and second conductors separately formed on the insulating base plate, a third conductor formed on the insulating base plate between the first and second conductors, conductive studs formed on the ends of the first and second conductors from a material having a different etching nature than the material from which the first, second, and third conductors are formed, a fourth conductor connected between the conductive studs and electrically insulated from the third conductor, the fourth conductor being so shaped that its end portions connected to the studs are made wider than its mid portion. In one embodiment an insulating resin material is molded in the space established between the fourth conductor and the first, second and third conductors. In another embodiment the insulating base plate is projected upward from the surface of third conductor and between the first and second conductors. In some embodiments an electronic element is embedded in the insulating base plate.

A method of making such a printed circuit board according to the invention comprises the steps of forming on opposite sides of a metal substrate first and second layers of a metal having a different etching reaction nature than the metal substrate, etching the first metal layer to form a cross-over conductor and the second metal layer to form a plurality of conductors at least one of which is positioned between terminal end portions of two others of the conductors, the cross-over conductor being formed to have a shape such that its end portions are wider than its mid portion and being located such that its end portions oppose the terminal end portions of the unconnected conductors through the metal substrate and finally applying an etchant to the metal substrate so as to remove all of it except stud like portions under the wider end portions of the cross-over conductor.

It is an object of the present invention to provide a printed circuit board with a cross-over area and conductors arranged with high density and accuracy.

It is a further object of the present invention to provide a printed circuit board in which the conductor members of a cross-over area are positively isolated electrically.

It is a further object of the present invention to provide a printed circuit board in which the conductor member of a cross-over area is positively coated on a insulating base plate.

It is a further object of the present invention to provide a printed circuit board in which electronic elements such as a semiconductor device, a resistor, a capacitor and so on are mounted on a printed circuit board in accordance with a predetermined wiring and in which the connection portions for the necessary electronic parts, the terminal portions for external connection and a heat sink are made integrally with the substrate and are arranged higher than the conductor members to facilitate their attachment.

It is a still further object of the present invention to provide method for making a printed circuit board.

It is a yet further object of the present invention to provide a method for making a printed circuit board in which an etching process with a so-called side-etching effect is employed.

DESCRIPTION OF THE PREFERRED EMBODIMENTS

A description will be now given of a circuit pattern of the invention with reference to FIGS. 1A to 1D and 3.

At first, a metal base plate or substrate 1 is prepared and metal layers 2*a* and 2*b*, which will form lead conductor members, are coated on both plane surfaces 1*a* and 1*b* of the metal base plate 1. In this case, the metal substrate 1 and the metal layers 2*a* and 2*b* are made of different metals with different natures for etching with the same etchant. That is to say, the metal substrate 1 is made of, for example, iron Fe plate with thickness of 0.25 mm., while the metal layers 2*a* and 2*b* are made of, for example, copper Cu by electroplating with thickness of 10~15 microns. It is, however, noted that metal which is scarcely etched by an etchant for the substrate 1 or etched at a speed much lower than that of the substrate 1 can be used as a material for making the metal layers 2*a* and 2*b*. It is also noted that the substrate 1 is desired to be scarcely etched by an etchant for the layers 2 *a* and 2*b* or etched at a speed lower than that of the layers 2*a* and 2*b*.

Figure 1A:
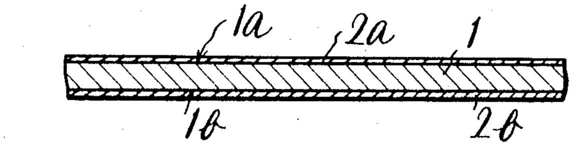
FIGS. 1A to 1D, inclusive, are cross-sectional views for illustrating steps of making a printed circuit board according to the present invention.
Figure 1B:
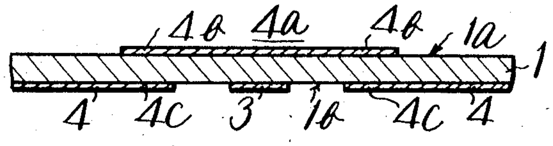
Figure 2:
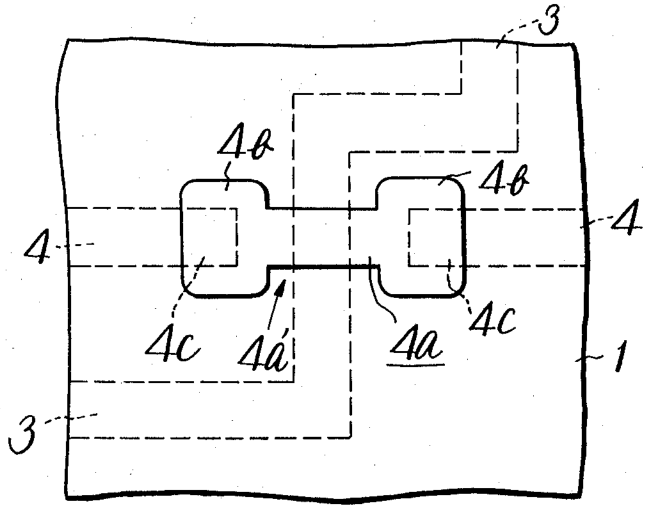
FIG. 2 is a plane view of the printed circuit board shown in FIG. 1B.

As shown in FIGS. 1B and 2, the layers 2*a* and 2*b* on both the surfaces 1*a* and 1*b* of the substrate 1 are subjected to a photo-etching process to remove undesired portions with the use of an etchant, for example, a solution of ferric chloride for the case where the layers 2*a* and 2*b* are made of copper Cu, with the result that first and second conductor members 3 and 4 are formed on the surface 1*b* of the substrate 1 from the layer 2*b* in a predetermined pattern. The conductor 3 is aligned between the terminated end portions 4*c* of the conductor 4 and is perpendicular to the conductor 4. A part 4*a* is made of the layer 2*a* on the opposite surface 1*a* of the substrate 1 by the same etching process as shown in FIG. 2. In other words, the layer 2*a* on the surface 1*a* is removed by etching except the part 4*a* which is hereinafter referred as a cross-over member. The cross-over member 4*a* has, at its both ends, terminal or connection portions 4*b*, which are overlapped through the base plate 1 with the end portions 4*c* of the second conductor member 4 and which are made greater in width than the end portions 4*c* of the second conductor member 4 as shown in FIG. 2.

Figure 1C:
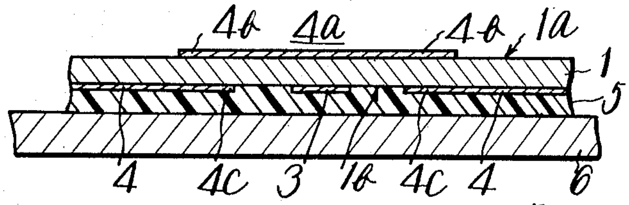

Thereafter, as shown in FIG. 1C a plate member or support 6 made of insulating material such as ceramic or the like is attached to the substrate 1 from its surface 1*b* with epoxy resin 5 for reinforcement. The plate member 6 for reinforcement may be made of conducting material, if it is attached to the substrate 1 through insulating material such, for example, as the resin 5 described just above.

Figure 1D:
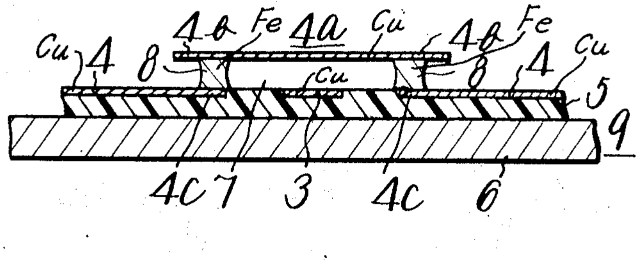
Figure 8:
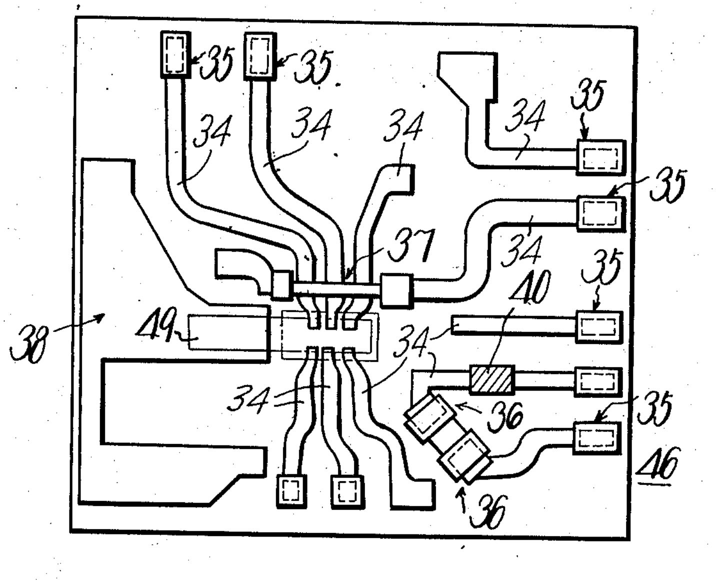
FIG. 8 is a plan view of the printed circuit board shown in FIG. 7F.
Figure 3:
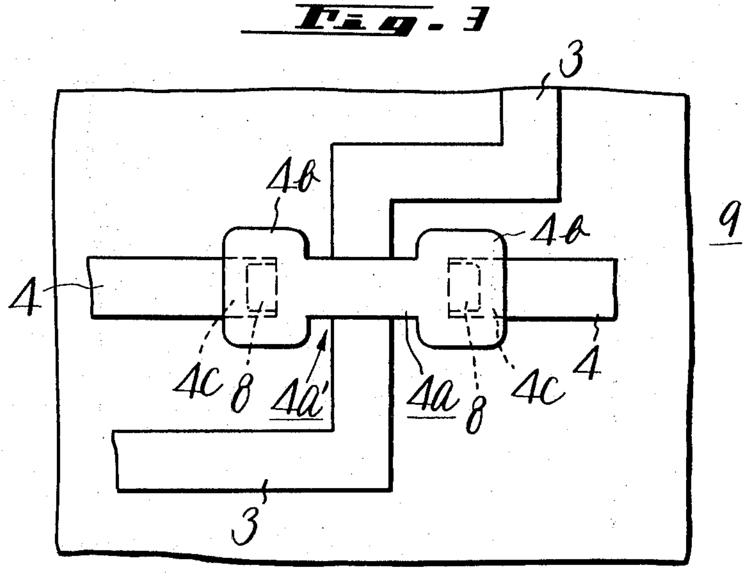
FIG. 3 is a plan view of the printed circuit board shown in FIG. 1D.

The metal substrate 1 is then subjected to etching from the surface 1*a* with the cross-over member 4*a* as a mask. In this case, the etching is carried out to have a so-called side-etching effect. During the etching process, the metal substrate 1 is removed except these portions under the connection portions 4*b* of the second conductor member 4 to form conductive studs 8 which electrically connect the end portions 4*c* of the second conductor member 4 to the cross-over member 4*a* at its end portions 4*b*. In this case, if the substrate 1 is made of iron, a solution of oxalic acid and hydrogen peroxide is used as etchant. Thus, a space 7 is formed between the cross-over member 4*a* and the first conductor member 3 under the former, as shown in FIGS. 1D and 3. In this case, it will be selfevident that the first and second conductor members 3 and 4 are not etched by the etching process for the substrate 1. Thus, a desired printed circuit board with a predetermined circuit pattern can be obtained.

With the printed circuit board of the present invention mentioned above, the first conductor member 3 is spaced from the second conductor member 4 at their crossing area 4'*a* with the space 7, so that they are electrically insulated positively at the crossing area 4'*a*. In other words, the first and second conductor members 3 and 4 cross each other without being connected electrically. However, one of the conductor members, namely the second conductor member 4 is positively connected electrically across the cross-over area 4'*a* through the studs 8 and the cross-over member 4*a*.

It is, however, possible, if desired, to insert insulating material such as resin into the space 7 to prevent the cross-over member 4*a* from being deformed and to enhance electrical insulation at the cross-over area 4'*a*.

With reference to FIGS. 4A to 4F and FIGS. 5 and 6, a second example of the present invention will be described.

Figures 4A, 4B, 4C, 4D, 4E, 4F:
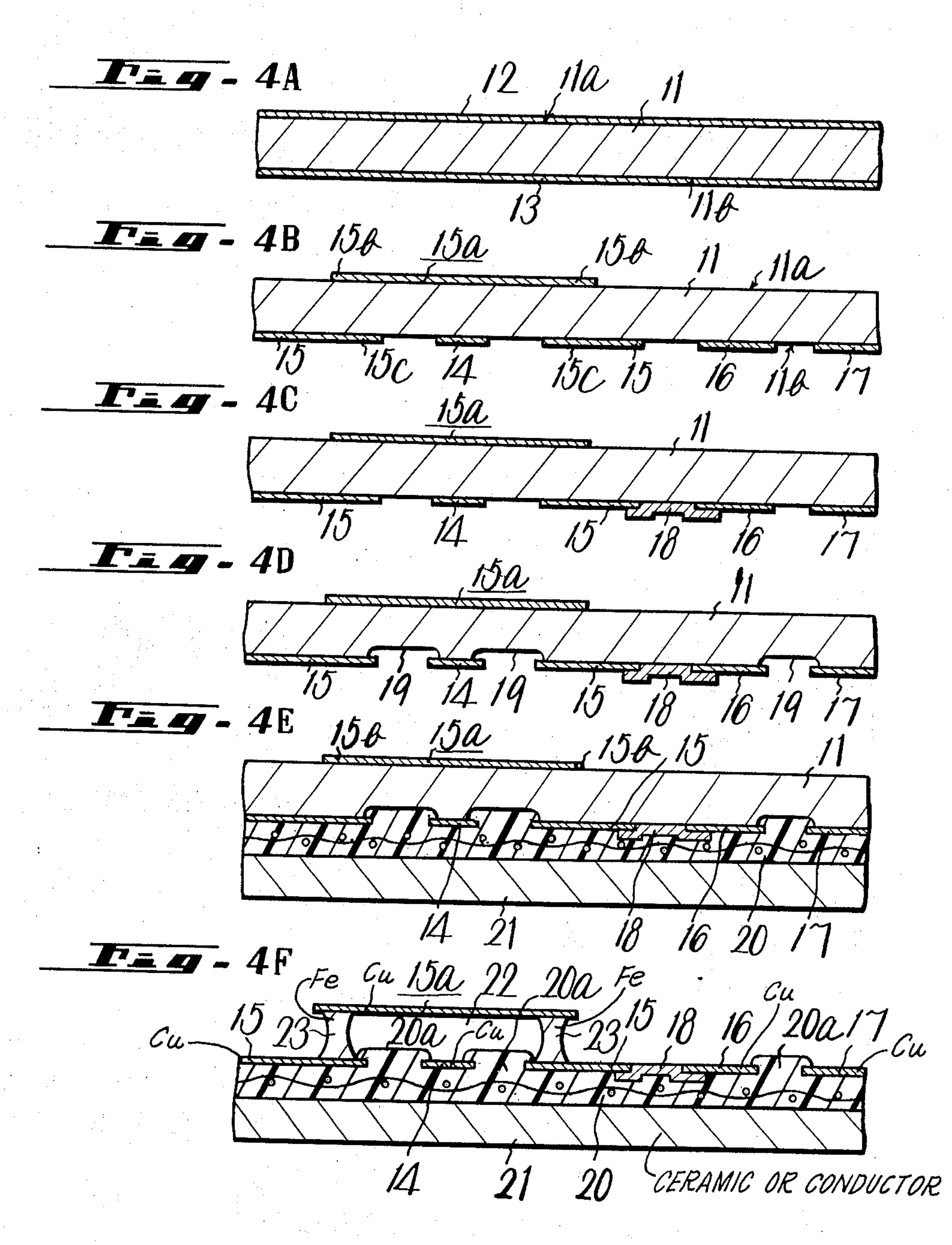
FIGS. 4A to 4F, inclusive, are cross-sectional views for illustrating steps of making another printed circuit board according to the invention.

As shown in FIG. 4A, a metal base plate or substrate 11 is prepared and layers 12 and 13 made of metal are formed on opposite plane surfaces 11*a* and 11*b* of the substrate 11 in a manner similar to that shown in FIG. 1A. The layers 12 and 13 finally form conductor members of a printed circuit board with a predetermined circuit pattern. The substrate 11 is made of a different metal than the layers 12 and 13 so that the metals have different natures for the same etchant.

Figure 5:
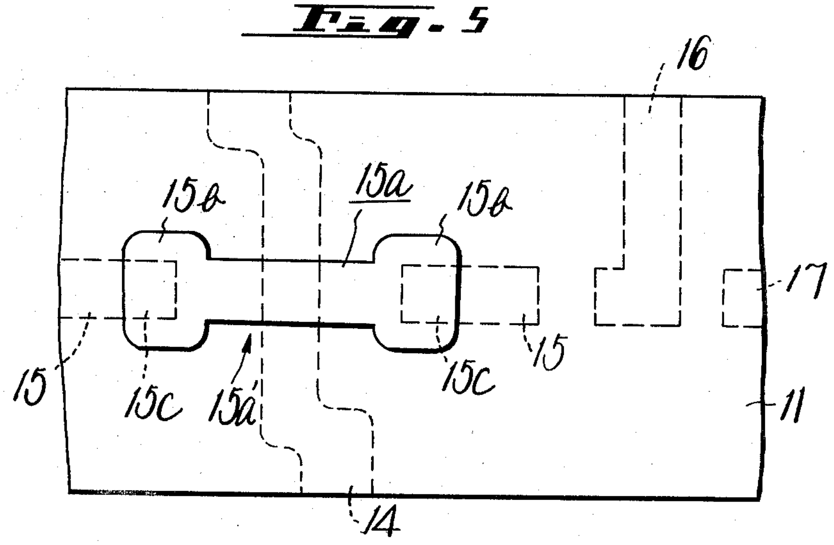
FIG. 5 is a plane view of the circuit pattern shown in FIG. 4B.
Figure 6:
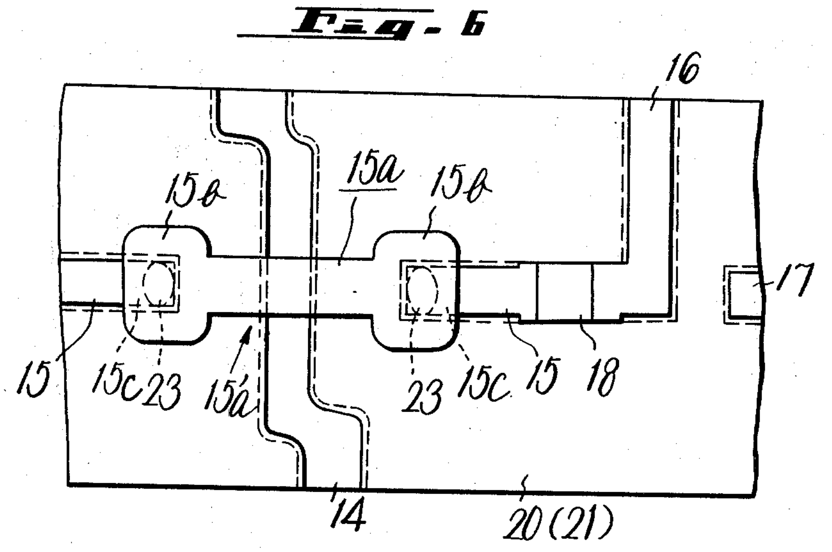
FIG. 6 is a plan view of the printed circuit board shown in FIG. 4F.

Then, as shown in FIGS. 4B and 5, the layers 12 and 13 on the substrate 11 are subjected to photo-etching process with an etchant which is a solution of ferric chloride if the layers 12 and 13 are made of copper Cu to remove their undesired portions and to form a first conductor member 14 located between terminated end portions 15*c* of a second conductor member 15 with a predetermined pattern on the surface 11*b*. The layer 12 on the upper surface 11*a* of the substrate 11 is removed by the etching process except a cross-over portion 15*a* which corresponds to the removed portion of the second conductor member 15 at the crossing area 15'*a*. The cross-over portion 15*a* has end portions 15*b*. The end portions 15*b* and both end portions 15*c* of the second conductor member 15 are overlapped, respectively, through the substrate 11 and the former is greater than the latter in width as shown in FIG. 5.

At the same time, third and fourth conductor members 16 and 17 are formed on the surface 11*b* of the substrate 11 from the layer 13 in addition to the first and second conductor members 14 and 15, as clearly shown in FIG. 5.

When a resistor, for example, is desired to be formed, a resistor 18 is formed by screen-printing on the surface 11*b* of the substrate 11 at a predetermined position, for example, at the position between the other end of the second conductor member 15 and the opposing end of the third conductor member 16 in a manner to rest on the end portions of the second and third conductor members 15 and 16, as shown in FIG. 4C. Thereafter, the substrate 11 is subjected to side-etching from the surface 11b and with the respective conductor members 14, 15, 16 and 17 as a mask. Thus, the exposed portions of the substrate 11 between the conductors 14 and 15 and between the conductors 16 and 17 are etched to a predetermined depth and concaved portions 19 are formed therebetween, as shown in FIG. 4D.

An insulating layer 20 made of epoxy resin, polyamide-imide resin, material mixed with the polyamide-imide and glass fibers or the like is formed on the surface 11*b* of the substrate 11 by coating and thereafter, a plate member 21 such as ceramic plate, copper plate, aluminum plate or the like is attached to the layer 20 at its free end surface for reinforcement, if desired, as shown in FIG. 4E. In this case, the insulating layer 20 is so formed that it protrudes into the concave portions 19 to engage with the exposed inner surfaces of the respective conductor members 14, 15, 16 and 17, as shown in FIG. 4E.

Then, the substrate 11 is further subjected side-etching with a similar etchant and with the cross-over portion 15*a* as a mask to etch away or the remove the substrate 11 except stud portions 23 between the end portions 15*b* of the cross-over member 15*a* and the end portions 15*c* of the second conductor member 15. Thus, a space 22 is formed between the cross-over member 15*a* and the first conductor member 14. The stud portions 23 of the substrate 11 electrically connect the cross-over member 15*a* with the second conductor member 15 at the opposing portions. By the second etching of the substrate 11, the portions of the insulating layer 20, which protrude into the concaved portions of the base plate 11 previously formed, remain as projecting portions 20*a* (refer to FIGS. 4F). In this case, it should be noted that the respective conductor members 14, 15, 16 and 17 are not etched with the etchant for the substrate 11.

A third example of the present invention will be hereinbelow described with reference to FIGS. 7A to 7F and 8. A metal base plate or substrate 31 is prepared at first and then metal layers 32 and 33 having different etchant reaction natures from the substrate 31 are formed on both surfaces 31*a* and 31*b* in the manner as described above, as shown in FIG. 7A. In this case, if the layers 32 and 33 are made of copper Cu, respectively, the substrate 31 may be made of iron Fe, while if the former are made of nickel Ni, the latter may be made of copper Cu. The substrate 31 may be selected to be, for example, 0.25 mm, in thickness and the layers 32 and 33 may be selected to be, for example, 10~15 microns in thickness.

Figures 7A, 7B, 7C, 7D, 7E, 7F:
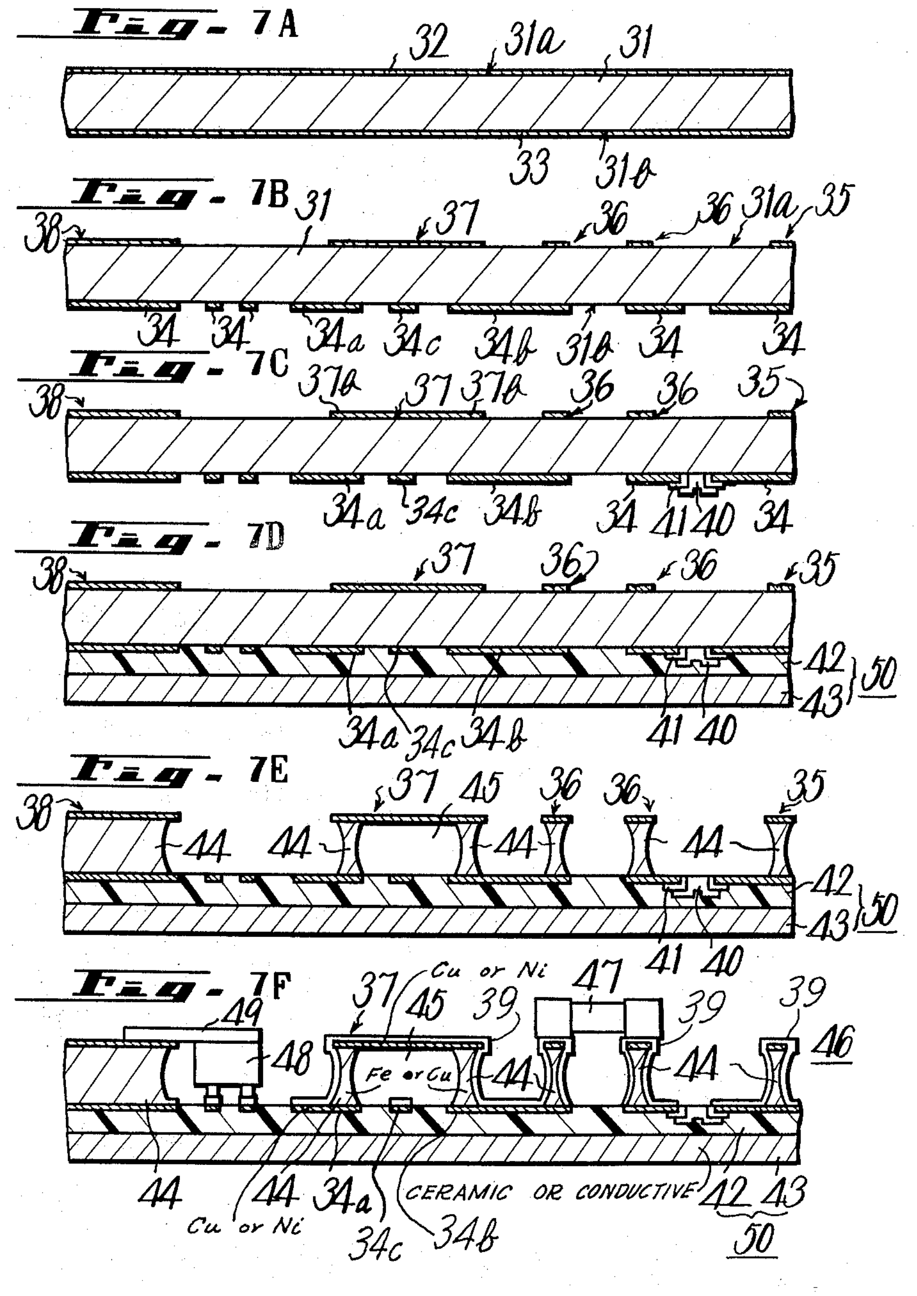
FIGS. 7A to 7F, inclusive, are cross-sectional views for illustrating steps of making still another printed circuit board according to the invention.

Next, one of the layers, namely the layer 33 is subjected to etching to remove unnecessary portions and to form respective conductor members 34, 34*a*, 34*b* and 34*c* with a desired pattern and with the conductor 34*c* between the conductors 34*a* and 34*b*. The other layer 32 is also subjected to etching to remove unnecessary portions and to form terminal portions 35 for external connection to the respective conductor members 34, connecting portions 36 to which external electronic elements, for example, are connected, and a heat sink 38 used for radiating away heat therethrough as shown in FIG. 7B. If the layers 32 and 33 are formed of copper Cu, a solution of ammonium persulfate may be employed as an etchant. The cross-over member 37 is so formed that its end portions 37*b*, at which it is connected between the conductor members 34*a* and 34*b* across the other conductor member 34*c*, are greater than its mid portion in width.

A resistor 40 is formed between predetermined conductor members 34 by screen-printing as shown in FIG. 7C. The resistor 40 is formed by coating silver paste 41 on the conductor members 34 at the portions to be connected by printing and then the resistor 40 is coated on the silver paste layer 41.

Thereafter, as shown in FIG. 7D, an insulating support 50 consisting of an epoxy resin layer 42 and a ceramic plate 43 is attached to the surface 31*b* of the substrate 31. It is also possible to replace the ceramic plate 43 with a plate made of conductive material in other embodiments.

An etching process with the side-etching effect is carried out for the substrate 31 from its upper surface 31*a* with the conductor members 35, 36, 37 and 38 on the surface 31*a* as a mask to remove the substrate 31 except the portions between the ends 37*b* of the cross-over member 37 and the conductor members 34*a* and 34*b* and between other the conductor members 35, 36, and 38 and the conductor member 34 as shown in FIG. 7E. In this case, if the substrate 31 is made of iron Fe, a mixture of oxalic acid and hydrogen peroxide solution is used as an etchant for the substrate 31.

Thus, the terminals 35, the connecting portions 36 for the external electronic elements and the member 38 are arranged higher than the conductor members 34 by conductive studs 44 made of the parts of the substrate 31 and formed in inner curved configuration by the side-etching effect for the substrate 31. Further, a space 45 is formed under the cross-over portion 37 and above the conductor members 34*a*, 34*b* and 34*c*.

Thereafter the printed circuit board is immersed in a non-electrolyte solution to form on the respective conductive studs 44, conductor members 34 34, 34*a*, 34*b*, 34*c*, 35, 36, and 37 layers 39 of, for example, nickel by plating as shown in FIG. 7F. In this case, the conductive studs 44 are made of iron Fe and the conductor members formed on the upper and lower surfaces 31*a* and 31*b* of the substrate 31 are made of copper Cu, by way of example, that is, they are made different metals so that the above non-electrolyte plating is easily carried out due to the so-called local cell effects established therebetween.

In the first embodiment of the invention described with reference to FIGS. 1A to 1D, 2 and 3, all of the substrate 1 is removed by etching with the so-called side-etching effect except the studs 8 between the end portions 4*b* of the cross-over conductor member 4*a* and the opposing end portions 4*c* of the second conductor member 4. In other words, the space 7 is formed above the first conductor member 3 at the crossing area 4'*a* between the first and second conductor members 3 and 4, and the second conductor 4 crosses the first conductor member 3 through the cross-over member 4*a* which is spaced apart from the first conductor member 3 but is connected to the second conductor member 4 through the studs 8 formed of the substrate 1. As a result, the printed circuit board 9 according to the invention can be manufactured easily as compared with a case where two conductor members are crossed over through a lead wire, and the printed circuit board of the invention can be made accurate in arrangement and with high density.

Further, the connecting portions 4*b* of the cross-over member 4*a* are selected greater than the mid portion of the cross-over member 4*a* in width in accordance with the thickness of the substrate 1, so that the portions of the substrate 1 under the portions 4*a* remain without being etched by the etching process with the so-called side-etching effect to form the studs 8. Accordingly, the portions 4*b* of the cross-over member 4a are positively connected to the portions 4*c* of the second conductor 4 electrically through the studs 8.

In the second embodiment of the invention described in connection with FIGS. 4A to 4F, 5 and 6, the first conductor member 14 crosses the second conductor member 15 at the area 15'*a* with the space 22 therebetween, that is, electrically insulated from the member 15, and the insulating layer 20 is projected upward from the surface of the first conductor member 14 under the cross-over member 15*a* as shown at 20*a*.

In the printed circuit board of the invention of the second embodiment, one of the conductor members crosses the other conductor member with the space 22 therebetween at the crossing area 15'*a*, so that its manufacturing process is simplified while allowing greater accuracy and density. Further, since the portions 20*a* of the insulating layer 20 under the cross-over member 15*a* are projected above from the surface of the first conductor 14, the distance between the cross-over member 15*a* and the first conductor 14 can be made short because even if the cross-over portion 15*a* may be curved downwardly due to its thickness of 10~15 microns when electronic parts are mounted on the board, the cross-over member 15*a* is prevented from being connected to or contacting the first conductor member 14 because the cross-over member 15*a* would only contact the projected portions 20*a*.

If a printed circuit board is desired in which no support, such as the support 21 of the invention, is provided but instead a flexible insulating base plate such as the insulating plate 20 of the invention is only provided as a backing member then with a conventional printed circuit board, in which the adhesion power between the insulating layer and the conductor members is generally rather weak, there is the danger that the bonded portions will be peeled off when electronic parts are attached to the board by soldering.

However, with the present invention, the conductor members 14, 15, 16 and 17 of the printed circuit board are formed in such a manner that their marginal edge portions are embedded in the insulating layer 20, so that the drawback encountered in the prior art mentioned just above is avoided.

Further, since the insulating layer 20 between the adjacent conductor members is swollen upward in the invention, a projecting electrode of a semiconductor element is positioned positively without being shifted when it is attached by face-bonding.

In the third embodiment of the invention described in connection with FIGS. 7A to 7F and 8, the process of attaching electronic parts to the printed circuit board 46 is greatly simplified. For example a capacitor 47 with no lead wires is attached to the connecting portions 36 to bridge them by soldering and s semiconductor element 48 is attached to the other conductor members by face-bonding. A heat radiating plate 49 is mounted on the upper surface of the semiconductor element 48 and a part of the heat radiating plate 49 is attached to the heat conducting body 38 formed flush with the upper surface of the element 48.

Further, since the terminals 35 for external connection are to be soldered and the conductor members 36 to which an electronic element is attached are formed above the conductor members 34 in the third example, the connection of external lead wires, the capacitor 47 and the like can be made easily and positively. In the other words, the printed circuit board 46 is made compact as a whole and the positioning of the respective elements is easily achieved even if the elements are arranged with high density. Further, their soldering is simplified since the parts to be soldered are limited. In addition, short-circuiting between unnecessary parts due to flow of molten solder is avoided, because the studs 44 have an inner curved configuration which rejects storing the molten solder.

Because the conducting plate 38 for heat radiation over a large surface area is formed integral with the other conductor members and it is formed at the same level to that of the semiconductor element 48 from which heat must be radiated away, the heat radiating plate 49 for the semiconductor element 48 can be extended to be attached to the heat conducting member 38 to enhance the heat radiating effect.

In addition, in the invention the electronic parts, such as the capacitor 47, are mounted above the conductor members 34, so that even if another conductor member is formed passing through between the adjacent conductor members 34 between which the capacitor 47 is connected, the conductor member is prevented from being accidently connected to the capacitor 47.

Further, since the substrate 31 and accordingly the studs 44 are made of a different metal from that of the layers 31 and 32 and accordingly from the conductor members 34, local cells are formed between the different metals, which will mean that the printed circuit board thus formed can be easily subjected to non-electrolyte plating without pre-treatment.

The terms and expressions which have been employed here are used as terms of description and not of limitation, and there is no intention in the use of such terms and expressions, of excluding equivalents of the features shown and described, or portions thereof, it being recognized that various modifications are possible within the scope of the invention claimed.

We claim as our invention

1. A method of manufacturing a printed circuit board having at least one cross-over area comprising the steps of:

a. forming first and second conductive layers on opposite sides of a conductive substrate, the material of the first and second layers having a different etching characteristic than the substrate material, b. etching the first layer to provide at least two terminal portions of a predetermined width, c. etching the second layer to form a plurality of conductive paths, at least two of which end at locations opposed to separate terminal portions of the etched first layer, d. securing the etched, conductive paths of the second layer to an insulator support; and e. etching the conductive substrate away to form projecting studs which connect the respective opposed terminal portions of the first layer with their corresponding opposed conductive path ends of the second layer.

2. The method of manufacturing a printed circuit board as recited in claim 1 wherein the step of etching the first layer comprises forming a conductive path portion from the first layer which connects the two terminal portions, the path portion being formed to have a narrower width than the width of the terminal portions.

3. A method of manufacturing a printed circuit board as recited in claim 1 comprising the further step of attaching an electronic element between the two terminal portions.

4. A method of manufacturing a printed circuit board having at least one cross-over area comprising the steps of: forming first and second metal layers on opposite plane surfaces of a metal substrate, the metal of the first and second layers having different etching characteristics from the metal substrate, etching the first metal layer to form a first conductor, etching the second metal layer to form at least a second and third conductor, the first conductor being formed such that its end portions are wider than its mid portion and are opposed to the second and third conductors at their end portions through the metal substrate, securing at least the second and third conductors to an insulating substrate, and etching the metal substrate so as to remove it except for portions under the wider end portions of the first conductor.

* * * * *